United States Patent [19]
Mooradian et al.

[11] Patent Number: 5,461,637
[45] Date of Patent: Oct. 24, 1995

[54] HIGH BRIGHTNESS, VERTICAL CAVITY SEMICONDUCTOR LASERS

[75] Inventors: Aram Mooradian, Winchester; Mark E. Kuznetsov, Lexington, both of Mass.

[73] Assignee: Micracor, Inc., Acton, Mass.

[21] Appl. No.: 214,878

[22] Filed: Mar. 16, 1994

[51] Int. Cl.[6] .................................. H01S 3/05; H01S 3/18
[52] U.S. Cl. ........................... 372/92; 372/11; 372/98; 372/18; 372/45
[58] Field of Search ............................. 372/45, 46, 92, 372/96, 98, 11, 12, 18, 74

[56] References Cited

U.S. PATENT DOCUMENTS

| | | | |
|---|---|---|---|
| 3,688,388 | 9/1972 | Dyment et al. . | |
| 4,378,599 | 3/1983 | Damen et al. . | |
| 4,539,687 | 9/1985 | Gordon et al. . | |
| 4,745,618 | 5/1988 | Burger | 372/101 |
| 4,787,086 | 11/1988 | Dentai et al. | 372/19 |
| 4,847,851 | 7/1989 | Dixon | 372/75 |
| 4,872,175 | 10/1989 | Nakatsuka et al. | 372/46 |
| 4,872,177 | 10/1989 | Baer et al. | 372/75 |
| 4,890,289 | 12/1989 | Basu et al. | 372/33 |
| 4,935,939 | 6/1990 | Liau et al. | 372/98 |
| 4,947,402 | 8/1990 | Kane | 372/70 |
| 4,949,350 | 8/1990 | Jewell et al. . | |
| 5,001,718 | 3/1991 | Burrows et al. | 372/33 |
| 5,033,052 | 7/1991 | Masuko et al. | 372/36 |
| 5,046,070 | 9/1991 | Negus | 372/33 |
| 5,052,016 | 9/1991 | Mahbobzadeh et al. . | |
| 5,073,041 | 12/1991 | Rastani | 395/33 |
| 5,073,892 | 12/1991 | Vomi et al. . | |
| 5,081,639 | 1/1992 | Snyder et al. | 372/101 |
| 5,093,838 | 3/1992 | Kubota | 372/107 |
| 5,123,025 | 6/1992 | Papuchon et al. | 372/72 |
| 5,123,026 | 6/1992 | Fan et al. | 372/75 |
| 5,131,002 | 7/1992 | Mooradian . | |
| 5,132,980 | 7/1992 | Connors et al. | 372/33 |
| 5,148,322 | 9/1992 | Aoyama et al. | 359/708 |
| 5,161,164 | 11/1992 | Shigihara et al. | 372/20 |
| 5,177,752 | 1/1993 | Ohya et al. . | |
| 5,228,049 | 7/1993 | Paoli | 372/50 |
| 5,245,618 | 9/1993 | Masuda et al. | 372/22 |
| 5,253,262 | 10/1993 | Kurobe et al. . | |
| 5,257,277 | 10/1993 | Yagi et al. | 372/75 |
| 5,265,116 | 11/1993 | Mooradian | 372/75 |
| 5,287,377 | 2/1994 | Fukuzawa et al. | 372/45 |

FOREIGN PATENT DOCUMENTS

| | | |
|---|---|---|
| 0280484 | 11/1988 | Japan . |
| 4247676 | 9/1992 | Japan . |

*Primary Examiner*—Rodney B. Bovernick
*Assistant Examiner*—Robert McNutt
*Attorney, Agent, or Firm*—Hamilton, Brook, Smith & Reynolds

[57] ABSTRACT

An apparatus and method for producing laser radiation from a vertical cavity semiconductor laser are disclosed. A preferred embodiment includes a quantum-well region formed over a semiconductor substrate. A first reflective surface is formed over the quantum-well region, and a second reflective surface is formed over the substrate, opposite the first reflective surface, forming a laser cavity. The quantum-well region is optically pumped, producing laser oscillation. The absorbed pump power causes a thermal lensing effect within the semiconductor material, stabilizing the transverse spatial mode of the laser cavity. The invention has applications in optical communication and laser printing.

38 Claims, 6 Drawing Sheets

HIGH BRIGHTNESS, VERTICAL CAVITY SEMICONDUCTOR LASERS

BACKGROUND OF THE INVENTION

Optically-pumped solid-state lasers have been useful sources of coherent radiation for more than 20 years. In recent years, improvements in laser performance have resulted from the fabrication of semiconductor quantum-well structures. In a quantum-well structure, thin atomic layers of smaller energy bandgap semiconductor material, for example GaAs, are sandwiched between thin layers of wider bandgap material, for example $Al_xGa_{(1-x)}As$, to form potential wells in the conduction and valence bands. Such wells restrict or limit carrier/electron movement to two dimensions. Quantum-well heterostructures generally exhibit more efficient luminescence intensities than bulk crystal heterostructures and therefore, have been incorporated into the active region of semiconductor laser devices.

SUMMARY OF THE INVENTION

The present invention is directed to an apparatus and method for producing laser radiation from a quantum-well semiconductor laser. The apparatus of the invention comprises a substrate preferably of semiconductor material, having first and second opposed faces. A mirror having a predetermined radius of curvature is formed over the first face of the substrate. A quantum-well structure is formed on the second face of the substrate. A second mirror is formed on the quantum-well structure, the first and second mirrors defining a resonant cavity therebetween. A source is provided for electrically or optically pumping the quantum-well layer to produce laser gain. The laser gain causes a laser mode having a particular wavelength and a particular transverse diameter to oscillate. The radius of curvature of the first mirror is formed as a function of the optical length of the resonant cavity, the diameter of the oscillating mode, and the wavelength of the oscillating mode.

In another embodiment, the second mirror has a predetermined radius of curvature in addition to the first curved mirror.

In another embodiment, the substrate is formed of semiconductor or other light-transparent material having a positive temperature variant refractive index and the first and second mirror on the substrate are fabricated substantially flat. As the laser is pumped, the absorbed pump light causes heating of the semiconductor material and therefore a thermal lensing effect within the laser cavity. The thermal lens is caused by the thermally induced increase in refractive index or an actual physical bulging of the material surface due to thermal expansion. The thermal lens causes an effective mirror radius of curvature which is a function of absorbed pump power, size of the pumped spot, thermal conductivity of the material, heat sinking conditions, refractive index variation with temperature, and thermal expansion coefficient.

The output radiation of the laser may be converted to a second harmonic using well known non-linear frequency conversion materials.

The laser may be used to generate trains of short optical pulses by operating in the gain-switched, Q-switched or modelocked regime.

The laser output can be coupled to an external cavity to extend functionality of the device. For example, the laser with an external cavity may be tuned by a grating reflector, may be modelocked or may have narrow linewidth operation. The external cavity may also be used for controlling the transverse spatial mode of the laser.

For those applications which require several longitudinal modes, spatial hole burning may be induced in the laser by spacing the quantum-well regions so that they are near field antinodes corresponding to the different axial mode numbers.

In another embodiment, an electric field is applied in a direction transverse to that of the laser beam, sweeping optically excited carriers out of the gain region. This provides a means for modulating the amplitude of the laser output.

The laser frequency may be shifted by applying a longitudinal electric field to the quantum-well structure to provide a quantum-confined Stark shift to the gain peak.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
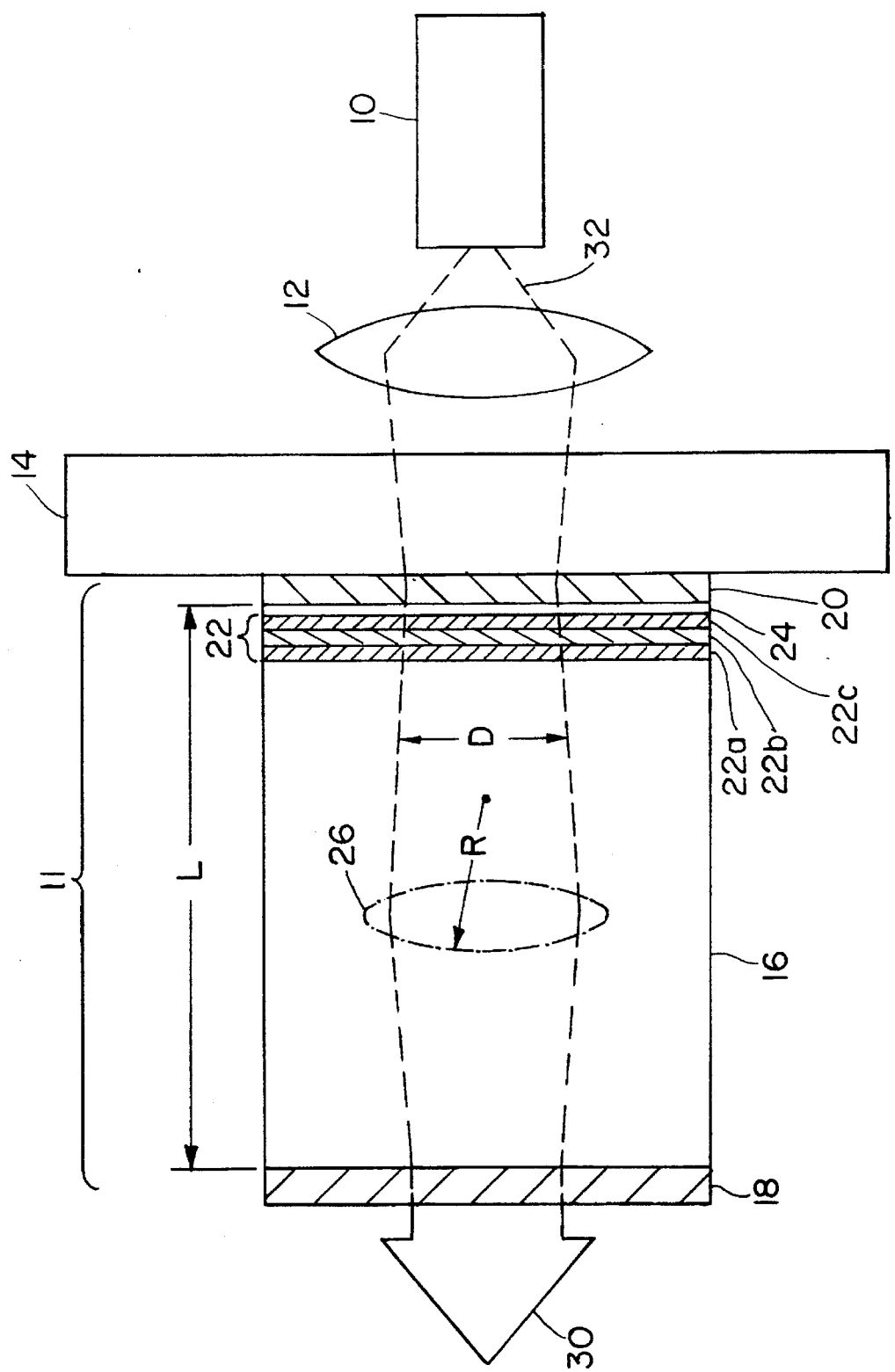
FIG. 1 is a cross-sectional view of a semiconductor laser in accordance with the present invention.

FIG. 1 is a cross-sectional view of a semiconductor laser in accordance with the present invention. A preferred embodiment includes an optical pump source 10, optional pump light focusing optics 12, a pump-light-transparent heat sink 14, and a semiconductor laser 11.

The laser 11 comprises a substrate 16, for example a semiconductor substrate, upon which alternate layers of semiconductor material 22a, 22b, 22c are formed. The layers 22a, 22b, 22c of semiconductor material form a single or multiple quantum-well structure. Note that for purposes of the invention, quantum-wells are not limited to thin layers but may be used in varying degrees of thickness. An optional buffer layer 24 is formed on the quantum-well structure. The opposing end surfaces are fabricated to form a flat-flat surface and are coated with a suitable material to form an entrance mirror 20 and an exit mirror 18 which define a resonant cavity of length L therebetween.

The resonant cavity is pumped by pump light 32 emitted from the pump source 10 and optionally focused by optics 12. At a threshold level, a mode of laser light begins to resonate. Pump light absorbed in the semiconductor material generates heat. The heat induces a change in the refractive index of the semiconductor material, causing a thermally-induced lensing effect in the laser cavity illustrated by the dot-dash lines 26. The lensing effect 26 automatically stabilizes the transverse spatial mode resonating within the laser cavity. The dn/dT, or change in refractive index n, with temperature T, for typical semiconductor materials ranges from $2\times10^{-4}$ to $4\times10^{-4}$ per degree celsius, which is at least 10 times greater than the dn/dT for solid-state materials such as Nd:YAG. The heat sink 14 comprises pump-light-transparent material such as sapphire, and is used to draw excess heat away from the laser.

For a laser with a near flat-flat cavity and two curved mirrors, the cavity mirror effective radius of curvature R, is related to the optical length of the cavity L, the wavelength of the mode λ and the mode diameter D, according to the following formula:

$$R = \left( \frac{D^2}{\lambda L} \right)^2 \frac{\pi^2 L}{8}.$$

In solid-state microchip lasers, pump light is absorbed along the whole length of the laser cavity and thermally induces an optical waveguide. In contrast, the semiconductor laser of FIG. 1 has light absorbed in a few-micrometer-thick absorbing region. The effective radius of curvature R induced by this thin thermal lens can be estimated from the following formula:

$$R = \frac{n_0 D_{th}^2}{8 h_{th} \Delta T \frac{dn}{dT}}$$

assuming quadratic transverse temperature distribution. Here, $n_0$ is the material refractive index, $D_{th}$ and $h_{th}$ are the diameter and thickness of the heated region, and $\Delta T$ is the temperature rise at the center of the heated region.

The effective mirror radius is a function of the absorbed laser pump power, size of the pumped spot, heat sinking conditions, thermal conductivity of the material and the dn/dT for the material. A device of this sort with mirrors deposited on the opposing flat faces of the wafer may operate with power levels exceeding 1 watt continuous wave, with appropriate heat sinking.

With a cavity length of a few hundred micrometers to a few millimeters, a stable $TEM_{00}$ mode is produced with a laser system made in accordance with the above formula. In contrast to the solid-state microchip lasers of the prior art, the quantum-well gain regions of the present invention must be positioned near the anti-nodes of the laser optical standing wave. See U.S. Pat. No. 5,131,002, incorporated herein by reference. This spatial positioning ensures efficient power extraction from the laser gain medium and also ensures that a single longitudinal mode is produced. Also, by way of contrast with solid-state laser gain material, there is a near absence of spectral and spatial hole burning in semiconductor lasers. This phenomenon is described in Mark W. Fleming and Aram Mooradian, "Spectral Characteristics of External-Cavity Controlled Semiconductor Lasers," *IEEE Journal of Quantum Electronics,* Vol. QE-17, No. 1, 44–59, January 1981. This enables semiconductor quantum-well lasers to operate in a single longitudinal mode.

The pump light may be coupled into the semiconductor absorption region using any of several well known methods such as focusing with a lens, butt coupling, and fiber coupling. Because the absorption length is very short, typically about a few micrometers, one need only provide for mode-matched pumping in the transverse directions. In fact, concentration of the pump light can be accomplished with non-imaging optics.

Figure 2:
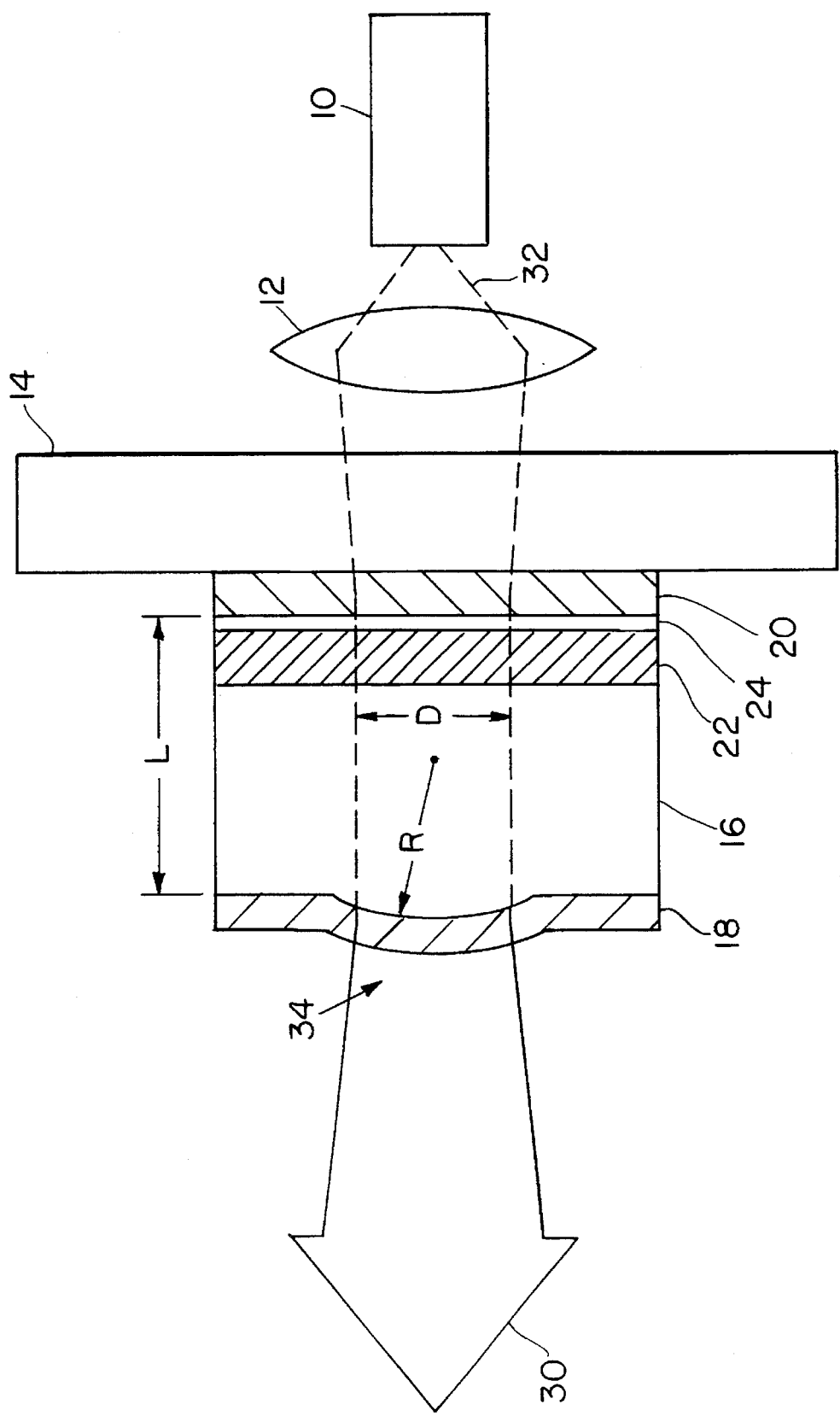
FIG. 2 is a cross-sectional view of a semiconductor laser wherein a microlens is formed on the substrate in accordance with the present invention.

FIG. 2 is a cross-sectional diagram of a semiconductor laser having a curved exit mirror 18 and a flat entrance mirror 20. In this case, the cavity mirror effective radius of curvature R, is related to the optical length of the cavity L and the mode diameter D as in the following formula:

$$R = \left( \frac{D^2}{\lambda L} \right)^2 \frac{\pi^2 L}{16}.$$

where λ is the wavelength of the mode oscillating within the laser cavity. Alternatively, microlenses may be bonded directly onto the wafer or binary optical lenses may be used with a dielectric reflective overcoat. Stable curved mirror resonators may also be fabricated directly onto the semiconductor laser wafer by well known techniques such as selective etching as described in U.S. Pat. No. 4,894,840, incorporated herein by reference.

The laser mirrors may be dielectric multi-layers directly deposited onto the substrate or may be grown by Molecular Beam Epitaxy (MBE) or Metal-Organic Vapor Phase Epitaxy (MOVPE) processes to deposit semiconductor multi-layers as is well known in the art. The entrance mirror 20 must be transmissive to light at the pump wavelength 32 while being highly reflective to the light at the lasing wavelength 30. The exit mirror 18 must be partially transmissive to light at the lasing wavelength, permitting a laser beam 30 to exit the laser.

Figure 3:
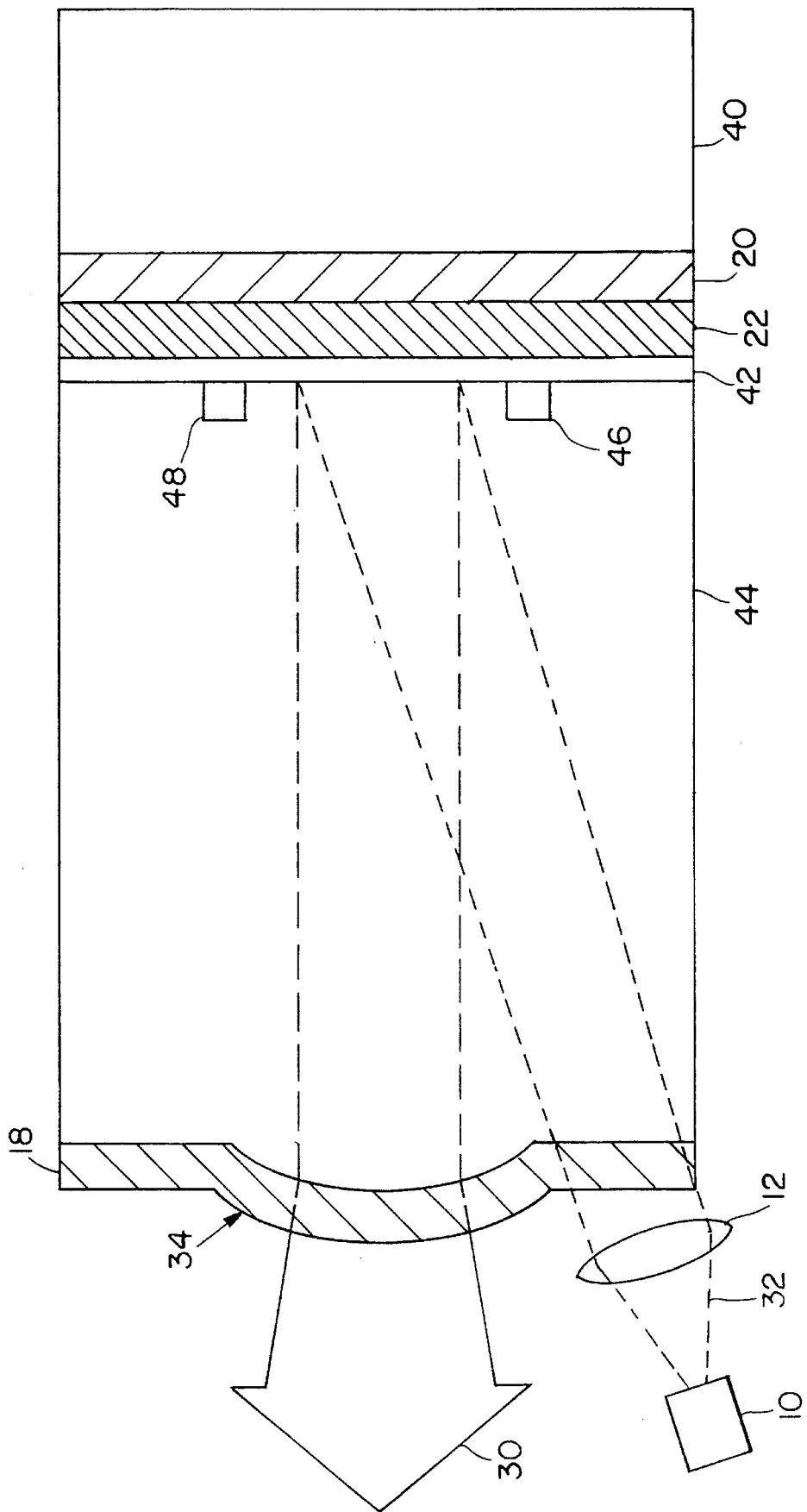
FIG. 3 is a cross-sectional view of a semiconductor laser wherein the laser cavity is pumped at the exit mirror and wherein the cavity is substantially comprised of a transparent material in accordance with the present invention.

The present invention may be configured in transmitting geometry with a pump-light-transparent heat sink as shown in FIG. 1 and FIG. 2, or may be configured in reflective geometry with a non-transparent heat sink, as shown in FIG. 3. In FIG. 3., a mirror layer 20 is provided over a semiconductor substrate 40. A quantum-well region 22 is formed over the mirror layer 20 and a cladding layer 42 is formed over the quantum-well region 22. A transparent material such as sapphire 44 is bonded to the cladding layer 42 to provide for the main body of the cavity. An exit mirror 18 is disposed on an opposite end of the body 44 forming a resonant cavity between mirror 18 and mirror 20. The quantum-well region 22 of the laser is pumped optically at the exit mirror 18 of the device. Pump source 10 provides light 32 which is focused by focusing optics 12 onto the quantum-well region 22. A resonant beam oscillates between mirror 18 and mirror 20 with optical lens 34 stabilizing the mode. The exit mirror 18 is partially transmissive of light at the mode wavelength, and thus a beam 30 is emitted. Note that in the embodiment of FIG. 3, the semiconductor substrate 40 is not part of the resonant cavity, unlike the embodiments of FIG. 1 and FIG. 2 wherein the semiconductor substrate 16 forms the main body of the resonant cavity.

An electric field may be provided at terminals 46 and 48 in a direction transverse to the direction of the oscillating laser beam. This sweeps the optically excited carriers out of the gain region, providing a means for amplitude modulating the laser output. Applying voltages approaching 10 to 30 volts across a 100 micrometer mode diameter provides a means for modulating the amplitude of the beam 30 at rates greater than 1 GHz.

Figure 4A:
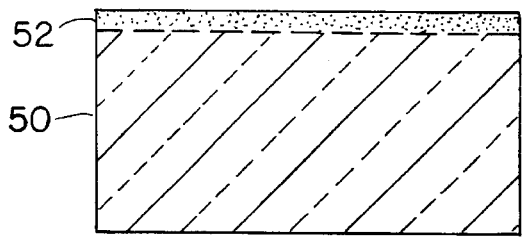
FIGS. 4A through 4E are cross-sectional views of a process for forming a semiconductor laser in accordance with the present invention.

FIG. 4A through FIG. 4E are cross-sectional views of a process for forming a semiconductor laser in accordance with the present invention. In FIG. 4A, a semiconductor wafer substrate 50 is provided having a thickness of approximately a few hundred micrometers to a few millimeters, or longer. Preferred substrate materials and quantum-well materials are, but not restricted to binary, ternary, or quaternary compounds taken from the group III–V table of elements and include GaAs or InP. For laser geometries, such as in FIGS. 1 and 2, the substrate material must be transparent for intended lasing wavelengths.

Figure 4B:
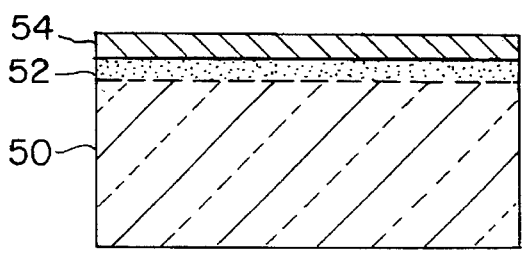
Figure 4C:
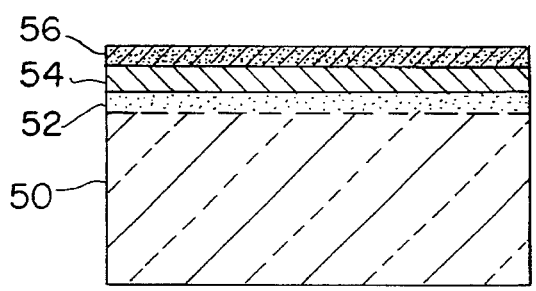
Figure 4D:
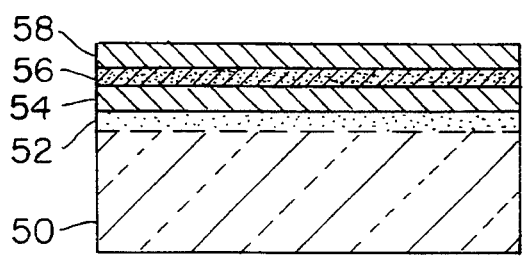
Figure 4E:
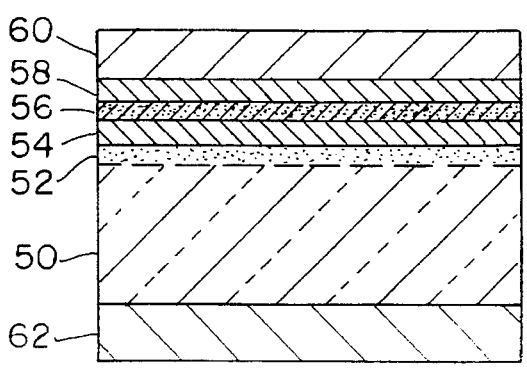

An optional buffer layer 52 may be formed over the substrate 50 to help lattice-match the substrate material to the quantum-well material. In FIG. 4B, a barrier layer 54 comprising, for example AlGaAs, is provided over the optional buffer layer 52. In FIG. 4C, a quantum-well layer 56 comprising, for example, GaAs or InGaAs is provided over the barrier layer 54. In FIG. 4D, a second barrier layer 58 is provided over the quantum-well layer 56. Several quantum-well layers spaced by the barrier layers may be formed over the first quantum-well. In FIG. 4E, a reflective mirror 60 is formed above the second barrier layer 58, and a second reflective mirror 62 is formed on the opposite face of the semiconductor wafer 50.

Figure 5:
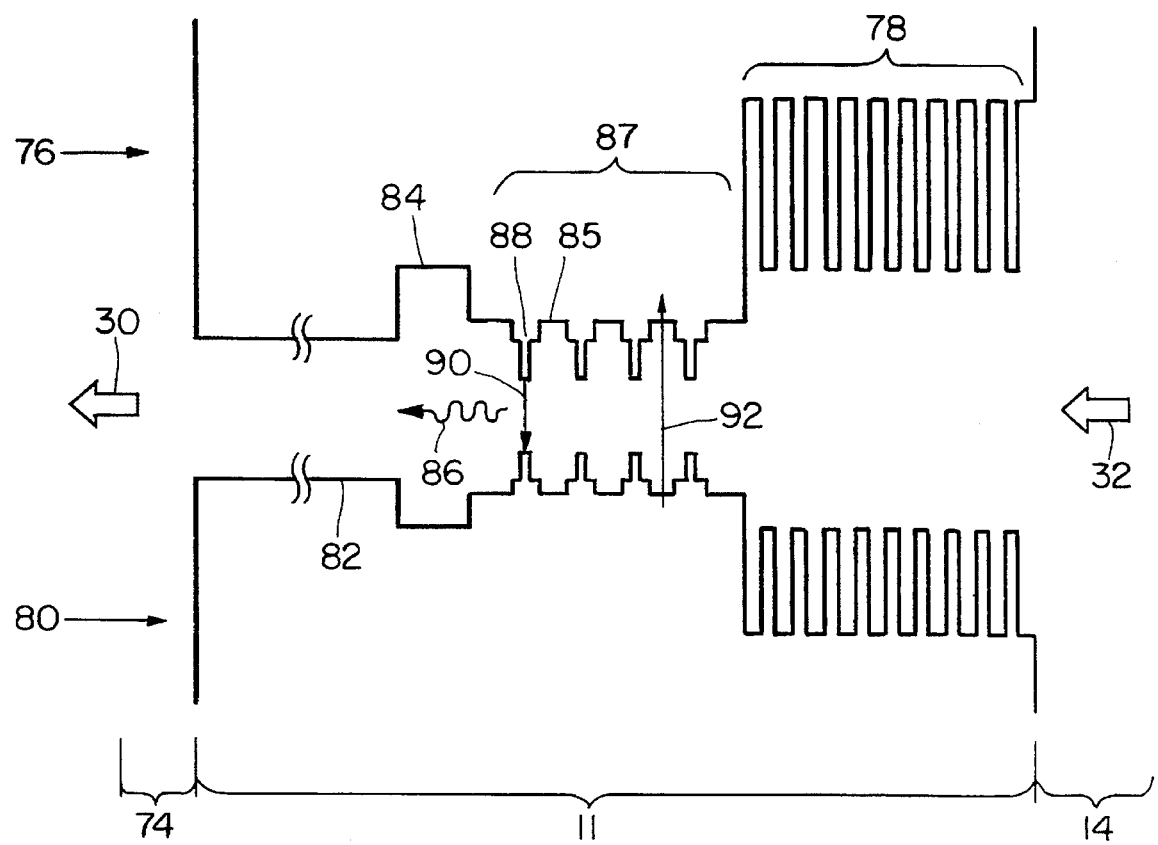
FIG. 5 is a bandgap diagram of a semiconductor laser in accordance with the present invention.

FIG. 5 is a bandgap diagram of a semiconductor laser configured in transmitting geometry such as those lasers shown in FIG. 1 and FIG. 2. The bandgap diagram shows both the conduction band 76 and the valence band 80 of the semiconductor laser. Pump light 32 is transferred through the transparent heat sink 14 into the semiconductor laser region 11. The pump light 32 passes through a high reflectivity dichroic mirror 78 to the active region 87. The active region 87 includes a plurality of quantum-well regions 88. The number of quantum-wells may vary, depending on the application. Pump absorption occurs in pump-absorbing regions 85 as indicated by arrow 92, creating excited carriers, electrons and holes, which diffuse into the quantum-well regions 88. Carriers recombine in the quantum-well regions 88, as indicated by arrow 90, to emit light 86 at the lasing wavelength. A carrier diffusion barrier 84 prevents excited carriers from spreading into the substrate 82 and thus being lost to the laser gain process. Laser output 30 is emitted at the output mirror 74.

Figure 6:
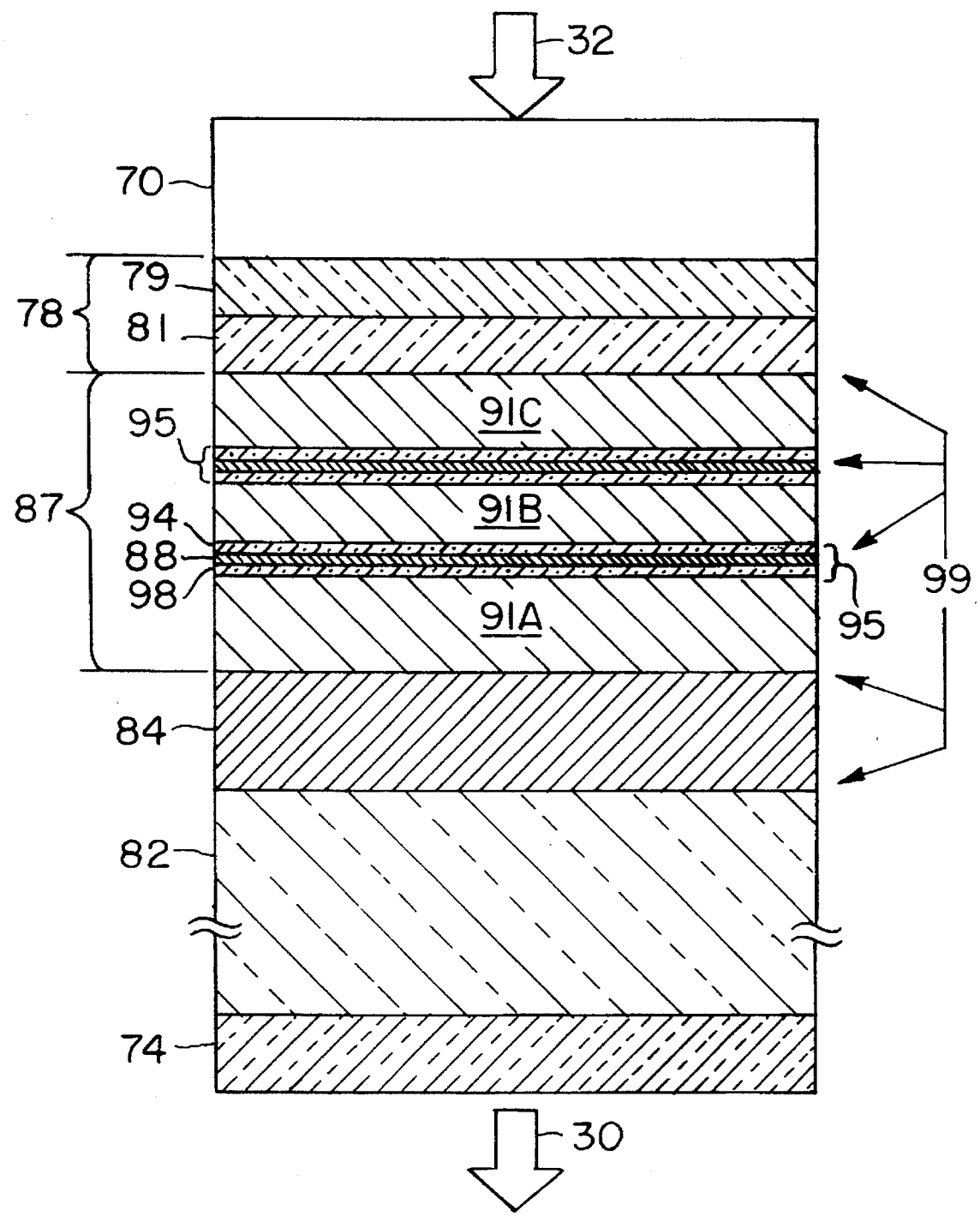
FIG. 6 is an illustration of a quantum-well wafer structure for a semiconductor laser in accordance with the present invention.

FIG. 6 is an illustration of a quantum-well wafer structure for the semiconductor laser of FIG. 1 and FIG. 2, corresponding to the bandgap diagram of FIG. 5 and formed, for example, by the process of FIG. 4. The quantum-well wafer structure is comprised of an undoped GaAs substrate 82 having a high reflectivity mirror 74 formed on one of the faces of the substrate 82. A carrier diffusion barrier 84 is formed on the face of the substrate which is opposite the high reflectivity mirror 74. The carrier diffusion barrier 84 is comprised, for example, of $Al_{0.2}Ga_{0.8}As$ of 288.8 nm thickness. The active region 87 is formed over the carrier diffusion barrier 84. The active region 87 is comprised of a plurality of quantum-wells 88 surrounded by barrier layers 94 and 98. The quantum-well/barrier regions 95 are separated by pump absorbing regions 91A, 91B and 91C. The quantum-well/barrier regions 95 and pump absorbing region 91B are repeated a plurality of times, for example periodically.

The first pump-absorbing layer 91A comprises, for example, $Al_{0.04}Ga_{0.96}As$ of 406.4 nm thickness. The barrier layers 94 and 98 are comprised of, for example, GaAs of 10.0 nm thickness. The quantum-well layers 88 are comprised of, for example, strained $In_{0.2}Ga_{0.8}As$ of 7.7 nm thickness. The second pump-absorbing layer 91B is comprised of, for example, $Al_{0.04}Ga_{0.96}As$ of 112.0 nm thickness. The top of the active region 87 is a pump absorbing layer 91C comprised of, for example, $Al_{0.04}Ga_{0.96}As$ of 126.1 nm thickness. Above the active region 87 is formed a high reflectivity multi-layer mirror 78 comprised of a plurality of layer pairs 81 and 79, for example 30 pairs. The pair comprises, for example, a layer 81 of $Al_{0.16}Ga_{0.84}As$ of 71.7 nm thickness, followed by a layer 79 of AlAs of thickness 82.9 nm.

The multilayer mirror 78 is bonded to a transparent heat sink 70. The laser is pumped 32 through the heat sink 70 and laser output 30 is emitted at mirror 74. The wavelength of the laser output for the above-described example is equal to 980 nm. The GaAs substrate is transparent at this laser wavelength. Note that the quantum-well gain regions 88 are positioned at the antinodes 99 of the laser optical standing wave.

For the optically-pumped laser configurations, no p-n junctions are required, and thus, the quantum-well materials used in the laser need not be doped. The present invention applies equally well to optical pumping as it does to diode current-injection pumping and electron-beam pumping of the semiconductor laser. Radial refractive index changes for transverse spatial mode confinement may also be produced by other techniques such as proton bombardment or ion implantation outside the gain region.

It should be noted that the substrate has been used to form a part of the cavity in the above description and also as the material upon which the multiple quantum-well layers are grown. Alternatively, the multiple quantum-wells can be grown separately and bonded to a light transparent material, such as quartz and sapphire, to form the extended longitudinal portion of the cavity.

In a conventional vertical cavity diode laser having a very short cavity, the absolute position of the cavity mode frequency must lie under the gain bandwidth for laser action to occur. The present invention permits several longitudinal cavity modes under the gain curve. This allows for lasing to occur under various conditions including a change of temperature as described in "Enhanced Performance of Offset-Gain High-Barrier Vertical-Cavity Surface-Emitting Lasers" by D. B. Young, et al., *IEEE Journal of Quantum Electronics* Vol. 29, 2013–2021, 1993.

The laser output of the present invention may be converted to other frequencies by second harmonic, sum, and difference frequency generation, or optical parametric conversion. This can be accomplished using well known nonlinear optical materials, such as KTP or $KNbO_3$. In contrast to most semiconductor lasers wherein the circulating intracavity power is slightly greater than the output power, the present invention has significantly greater circulating power densities thereby providing efficient intracavity harmonic conversion. The non-linear material may be bonded directly to the semiconductor wafer for mass production and to provide a robust structure. For intracavity frequency conversion, the second harmonic light propagating away from the output coupler will be absorbed in the semiconductor material, thereby optically pumping it. Alternatively, a dichroic mirror transparent at the laser wavelength and highly reflecting at the second harmonic wavelength can be deposited at the interface between the nonlinear optical material and the semiconductor.

A train of short optical pulses may be produced at the output of the laser using gain-switched, Q-switched, or modelocked laser operation. For example, passive Q-switching or modelocking can be accomplished by incorporating unpumped quantum-well regions inside the laser cavity.

The laser can be operated in an external cavity to extend functionality of the device. For example, a laser in accordance with the present invention having an external cavity may be tuned by a grating reflector, may be modelocked or may have narrow linewidth operation. A laser in accordance with the present invention may use an external cavity for transverse spatial mode control.

In fiber optical communication applications which require a suppression of the Stimulated Brillouin Scattering (SBS), it is important to reduce the power in each axial mode of the laser and have more such modes oscillating. This can be done by placing the quantum-well regions near the center of the cavity in the anti-node positions corresponding to the different axial mode numbers. This is the equivalent of induced spatial hole burning. By keeping the excited carriers confined within the quantum-well regions and separating these regions by diffusion barriers, the carriers will be unable to interact with each other by thermal diffusion, ensuring multimode operation through the equivalent of longitudinal spatial hole burning. Such devices could be used to transmit high power levels over long distances, for example remotely pumping optical fiber amplifiers for submarine communications. SBS can also be suppressed by frequency chirping or shifting the mode frequencies in a time which is short compared to the SBS build-up times. Frequency shifting could be accomplished by applying a longitudinal electric field to the quantum-well structure to provide a Stark shift to the gain peak. More conventional intracavity tuning techniques could also be used to shift the frequencies.

Note that the term "forming" as used herein is intended to broadly encompass methods such as depositing, sputtering, bonding, or other techniques for combining one or more materials.

While this invention has been particularly shown and described with references to preferred embodiments thereof, it will be understood by those skilled in the art that various changes in form and details may be made therein without departing from the spirit and scope of the invention as defined by the appended claims.

We claim:

1. A semiconductor laser system comprising:
    a) a body of material having first and second opposed faces, said body having a temperature variant index of refraction;
    b) a semiconductor quantum-well structure on said first face of said body, said quantum-well structure having a temperature variant index of refraction;
    c) a first mirror on said quantum-well structure;
    d) a second mirror on said second face of said body, said first and second mirrors defining a resonant cavity therebetween of length L; and
    e) an energy source for pumping said quantum-well structure with energy for producing laser gain in said quantum-well structure, said laser gain causing a laser beam of wavelength λ to propagate within said cavity, said energy being absorbed by said quantum-well structure thereby raising the temperature of a region proximal to said quantum-well structure by an amount ΔT, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature ΔT of said region, said thermal lens concentrating said laser beam substantially within a diameter D, said diameter D being a function of said thermal lens radius of curvature R, said length of said cavity L, and said wavelength λ of said laser beam, said cavity being of sufficient length L such that said thermal lens causes said laser beam to propogate with a stable transverse mode.

2. The laser system of claim 1 wherein said body is comprised of semiconductor material.

3. The laser system of claim 1 further comprising a frequency converter external to said resonant cavity for converting the frequency of said laser oscillation.

4. The laser system of claim 1 further comprising a frequency converter within said resonant cavity for converting the frequency of said laser oscillation.

5. The laser system of claim 1 wherein said quantum-well structures are spaced near antinodes of different longitudinal modes of said resonant cavity.

6. The laser system of claim 1 including a transverse electric field applied to said quantum-well structure for modulating the amplitude of said laser oscillation.

7. The laser system of claim 1 including a longitudinal electric field applied to said quantum-well structure for providing a quantum-confined Stark-shift of said laser oscillation gain peak.

8. The laser system of claim 1 further comprising an external reflector for transverse spatial mode control.

9. The laser system of claim 1 further comprising an external tuning element for wavelength tuning.

10. The laser system of claim 1 further comprising a gain switch for pulsing said laser oscillation.

11. The laser system of claim 1 further comprising a Q-switch for pulsing said laser oscillation.

12. The laser system of claim 1 further comprising a mode-locking apparatus for pulsing said laser oscillation.

13. The laser system of claim 1 wherein said energy source comprises an optical pump.

14. The laser system of claim 1 wherein said energy source comprises an electrical current-injection pump.

15. The laser system of claim 1 wherein said energy source comprises an electron beam pump.

16. The system of claim 1, wherein said diameter of said heated region $D_{th}$ is controlled by said energy source.

17. The system of claim 1, wherein said pump energy is directed into said cavity through said second mirror.

18. A semiconductor laser system comprising:
    a) a first body of material;
    b) a first mirror on said first body;
    c) a semiconductor quantum-well structure on said first mirror, said quantum-well structure having a temperature variant index of refraction;
    d) an optical pump for pumping said quantum-well structure with light energy for producing laser gain;
    e) a second body of material on said quantum-well structure having a temperature variant index of refraction, said second body being transparent to light at said optical pump wavelength, and transparent to light at said laser gain wavelength; and
    f) a second mirror on said second body; said first and second mirrors defining a resonant cavity therebetween of length L, said laser gain causing a laser beam of wavelength λ to propagate within said cavity, said pump energy being absorbed by said quantum-well structure thereby raising the temperature of a region proximal to said quantum-well structure by an amount ΔT, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter D being a function of said thermal lens radius of curvature R, said length of said cavity L, and said wavelength $\lambda$ of said laser beam, said cavity being of sufficient length L such that said thermal lens causes said lens beam to propogate with a stable transverse mode.

19. The system of claim 18, wherein said diameter of said heated region $D_{th}$ is controlled by said optical pump.

20. The system of claim 18, wherein said light energy is directed into said cavity through said second mirror.

21. A method of producing laser light from a semiconductor laser comprising the steps of:
   a) forming a first barrier layer over a first face of a body of material having opposing first and second faces, said body having a temperature variant index of refraction;
   b) forming a quantum-well structure over said first barrier layer, said quantum-well structure having a temperature variant index of refraction;
   c) forming a second barrier layer over said quantum-well layer;
   d) forming a first mirror over said second barrier layer;
   f) forming a second mirror over said second face of said body, said first and second mirrors defining a resonant cavity therebetween of length L; and
   g) pumping said quantum-well structure with a beam of pump energy for producing laser gain in said quantum-well structure, said laser gain causing a laser beam of wavelength $\lambda$ to propagate within said cavity, said energy being absorbed by said quantum-well structure thereby raising the temperature of a region proximal to said quantum-well structure by an amount $\Delta T$, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter D being a function of said thermal lens radius of curvature R, said length of said cavity L, and said wavelength $\lambda$ of said laser beam, said cavity being of sufficient length L such that said thermal lens causes said laser beam to propogate with a stable transverse mode.

22. A method of producing laser light from a semiconductor laser system comprising the steps of:
   a) providing a semiconductor quantum-well structure on a first face of a body of material having opposed first and second faces, said body and said quantum-well structure each having a temperature variant index of refraction;
   b) providing a first mirror on said quantum-well structure;
   c) providing a second mirror on said second face of said body, said first and second mirrors defining a resonant cavity therebetween of length L; and
   d) pumping said quantum-well structure with pump energy for producing laser gain in said quantum-well structure, said laser gain causing a laser beam of wavelength $\lambda$ propagate within said cavity, said energy being absorbed by said quantum-well structure thereby raising the temperature of a region proximal to said quantum-well structure by an amount $\Delta T$, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter D being a function of said thermal lens radius of curvature R, said length of said cavity L, and said wavelength $\lambda$ of said laser beam, said cavity being of sufficient length L such that said thermal lens causes said laser beam to propogate with a stable transverse mode.

23. The method of producing laser light of claim 22 further comprising the step of converting the frequency of said laser oscillation externally to said resonant cavity.

24. The method of producing laser light of claim 22 further comprising the step of converting the frequency of said laser oscillation internally to said resonant cavity.

25. The method of producing laser light of claim 22 further comprising the step of modulating the amplitude of said laser oscillation by applying a transverse electric field to said quantum-well structure.

26. The method of producing laser light of claim 22 further comprising the step of providing a quantum-confined stark-shift of said laser oscillation gain peak by applying a longitudinal electric field to said quantum-well structure.

27. The method of producing laser light of claim 22 further comprising the step of controlling the transverse spatial mode with an external reflector.

28. The method of producing laser light of claim 22 further comprising the step of tuning the wavelength of said laser oscillation with an external tuning element.

29. The method of producing laser light of claim 22 further comprising the step of pulsing said laser oscillation with a gain switch.

30. The method of producing laser light of claim 22 further comprising the step of pulsing said laser oscillation with a Q-switch.

31. The method of producing laser light of claim 22 further comprising the step of pulsing said laser oscillation with a mode-locking apparatus.

32. The method of claim 22, further comprising the step of controlling the diameter $D_{th}$ or thickness $h_{th}$ of said heated region by adjusting said pump energy.

33. The method of claim 22, further comprising the step of directing said pump energy into said cavity through said second mirror.

34. A method of producing laser light from a semiconductor laser system comprising the steps of:
   a) providing a first mirror on a first body of material;
   b) providing a semiconductor quantum-well structure on said first mirror, said quantum-well structure having a temperature variant index of refraction;
   c) providing a second body of material having a temperature variant index of refraction on said quantum-well structure;
   d) providing a second mirror on said second body, said first and second mirrors defining a resonant cavity therebetween of length L;
   e) pumping said quantum-well structure with a pump energy for producing laser gain in said quantum-well structure, said laser gain causing a laser beam of wavelength $\lambda$ to propagate within said cavity, said energy being absorbed by said quantum-well structure thereby raising the temperature of a region proximal to said quantum-well structure by an amount $\Delta T$, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter D being a function of said thermal lens radius of curvature R, said length of said cavity L, and said wavelength $\lambda$ of said laser beam, said cavity being of sufficient length L such that said thermal lens causes said laser beam to propogate with a stable transverse mode.

35. The method of claim 34, further comprising the step of controlling the diameter $D_{th}$ or thickness $h_{th}$ of said heated region by adjusting said pump energy.

36. The method of claim 34, further comprising the step of directing said pump energy into said cavity through said second mirror.

37. A semiconductor laser system comprising:
a) a body of material having first and second opposed faces, said body having a temperature variant index of refraction;
b) semiconductor quantum-well structures on said first face of said body, said quantum-well structures having a temperature variant index of refraction;
c) a first mirror on said quantum-well structures;
d) a second mirror on said second face of said body, said first and second mirrors defining a resonant cavity therebetween of length L;
e) an energy source for pumping said quantum-well structures with energy for producing laser gain in said quantum-well structures, said laser gain causing a laser beam of wavelength $\lambda$ to propagate within said cavity, said energy being absorbed by said quantum-well structures thereby raising the temperature of a region proximal to said quantum-well structures by an amount $\Delta T$, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter D being a function of said thermal lens radius of curvature R, said length of said cavity L, and said wavelength $\lambda$ of said laser beam, said cavity being of sufficient length L such that said thermal lens causes said laser beam to propogate with a stable transverse mode;
f) said quantum-well structures being spaced near antinodes of different longitudinal modes of said cavity.

38. A semiconductor laser system comprising:
a) a body of material having first and second opposed faces, said body having a temperature variant index of refraction;
b) a semiconductor quantum-well structure on said first face of said body, said quantum-well structure having a temperature variant index of refraction;
c) a first mirror on said quantum-well structure;
d) a second mirror on said second face of said body, said first and second mirrors defining a resonant cavity therebetween of length L;
e) an energy source for pumping said quantum-well structure with energy for producing laser gain in said quantum-well structure, said laser gain causing a laser beam of wavelength $\lambda$ to propagate within said cavity, said energy being absorbed by said quantum-well structure thereby raising the temperature of a region proximal to said quantum-well structure by an amount $\Delta T$, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter D being a function of said thermal lens radius of curvature R, said length of said cavity L, and said wavelength $\lambda$ of said laser beam, said cavity being of sufficient length L such that said thermal lens causes said laser beam to propogate with a stable transverse mode; and
f) a Q-switch for pulsing said laser beam.

* * * * *

UNITED STATES PATENT AND TRADEMARK OFFICE
CERTIFICATE OF CORRECTION

PATENT NO. : 5,461,637
DATED : October 24, 1995
INVENTOR(S) : Aram Mooradian and Mark E. Kuznetsov It is certified that error appears in the above-indentified patent and that said Letters Patent is hereby corrected as shown below:

Col. 8, line 4, delete "propogate" and insert --propagate--.

Col. 9, line 8, delete "propogate" and insert --propagate--.

Col. 9, line 46, delete "propogate" and insert --propagate--.

Col. 9, line 63, before "propagate" insert --to--.

Col. 10, line 10, delete "propogate" and insert --propagate--.

Col. 11, line 10, delete "propogate" and insert --propagate--.

Col. 12, line 5, delete "propogate" and insert --propagate--.

Col. 12, line 38, delete "propogate" and insert --propagate--.

Signed and Sealed this

Sixteenth Day of January, 1996

BRUCE LEHMAN

*Attest:*

*Attesting Officer*     *Commissioner of Patents and Trademarks*